United States Patent
Endrinal et al.

(10) Patent No.: US 10,324,131 B1
(45) Date of Patent: Jun. 18, 2019

(54) LASER-BASED INTEGRATED CIRCUIT TESTING TECHNIQUES

(71) Applicant: QUALCOMM Incorporated, San Diego, CA (US)

(72) Inventors: Lesly Endrinal, San Diego, CA (US); Rakesh Kinger, San Diego, CA (US); Joseph Fang, San Diego, CA (US); Srinivas Patil, Austin, TX (US); Lavakumar Ranganathan, San Diego, CA (US); Chia-Ying Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/872,281

(22) Filed: Jan. 16, 2018

(51) Int. Cl.
*G01R 31/3185* (2006.01)
*G01R 31/3183* (2006.01)
*G01R 31/311* (2006.01)
*G01R 31/3177* (2006.01)

(52) U.S. Cl.
CPC .... *G01R 31/318536* (2013.01); *G01R 31/311* (2013.01); *G01R 31/3177* (2013.01); *G01R 31/318335* (2013.01)

(58) Field of Classification Search
CPC .............. G01R 31/318536; G01R 31/318335
See application file for complete search history.

(56) References Cited

U.S. PATENT DOCUMENTS

| | | | | |
|---|---|---|---|---|
| 7,945,833 B1 * | 5/2011 | Wang | ............. | G01R 31/318547 714/729 |
| 8,645,896 B1 * | 2/2014 | Suri | ..................... | G06F 17/5081 716/136 |
| 2004/0237015 A1 * | 11/2004 | Abdel-Hafez | ............................... | G01R 31/318572 714/726 |
| 2005/0055617 A1 * | 3/2005 | Wang | ............. | G01R 31/318335 714/727 |
| 2008/0195346 A1 * | 8/2008 | Lin | ................ | G01R 31/318575 702/119 |
| 2008/0235544 A1 * | 9/2008 | Lai | ................. | G01R 31/318547 714/729 |
| 2011/0179325 A1 * | 7/2011 | Gupta | ............ | G01R 31/318547 714/727 |
| 2012/0043991 A1 * | 2/2012 | Lin | ................ | G01R 31/318575 326/16 |

(Continued)

*Primary Examiner* — Joseph D Torres
(74) *Attorney, Agent, or Firm* — Patterson & Sheridan, L.L.P (57) ABSTRACT

The present disclosure provide techniques for semiconductor testing, and more particularly, to systems and methods for laser-based fault isolation and design for testability (DFT) diagnosis techniques. In one embodiment, an integrated chip (IC) testing apparatus, includes an input pin; a decompressor connected to the input pin; a plurality of scan chains, each scan chain of the plurality of scan chains comprising a plurality of scan cells; a plurality of scan chain control elements, each scan chain control element of the plurality of scan chain control elements being connected between the decompressor and a respective scan chain of the plurality of scan chains, wherein each scan chain control element is configured to enable or disable test data from flowing from the compressor to the respective scan chain; a compressor connected to an output of each scan chain of the plurality of scan chains; and an output pin connected to the compressor.

12 Claims, 5 Drawing Sheets

(56) References Cited

U.S. PATENT DOCUMENTS

| | | | | |
|---|---|---|---|---|
| 2014/0149811 A1* | 5/2014 | Ross | ................. | G01R 31/2882 |
| | | | | 714/724 |
| 2014/0149812 A1* | 5/2014 | Tekumalla | ..... | G01R 31/318555 |
| | | | | 714/727 |
| 2015/0040087 A1* | 2/2015 | Lin | ................ | G01R 31/318575 |
| | | | | 716/109 |

* cited by examiner

LASER-BASED INTEGRATED CIRCUIT TESTING TECHNIQUES

INTRODUCTION

The present disclosure relates generally to semiconductor testing, and more particularly, to systems and methods for laser-based testing of integrated circuits (ICs).

Scan testing is a DFT methodology for checking the integrity of digital logic within ICs. Most types of digital failures can be captured by scan testing, which may include scan chain integrity tests, stuck-at-fault (SAF) tests, and transition delay fault (TDF) tests. Scan test patterns are normally generated using an automated test pattern generation (ATPG) tool, while scan design insertion is done through a DFT tool or software.

When an IC fails (or a device including the IC), scan test diagnosis may be used to identify a list of candidate nodes within the IC that may contain a fault and to assign each candidate node a confidence level (e.g., a confidence score) that is indicative of how well the fault model matches with the failure mode. An ideal test diagnostic result would comprise a single candidate node with a 100% confidence score. Unfortunately, this is not usually the case due to several factors, which include: decompressor and compressor logic, high compression ratio, functionally equivalent faults/logic, complexity and depth of the failing logic path, and the unstable nature of the failure mode itself.

Laser Voltage Imaging (LVI) and Laser Voltage Probing (LVP) are two electrical fault isolation techniques that are used in digital circuit debug. For example, LVI and LVP may be used to debug scan chain integrity and logic failures on, for example, flip-chip integrated circuits. In particular, LVI provides a way to map locations of IC features (e.g., transistors) within the IC that are periodically switching at a specific frequency. Hence, it is an important requirement for LVI mapping that the signals stimulating the chip and being measured are completely periodic signals. LVI is often used for the debug of PLL/CXO clock path and scan chain integrity failures because both cases involve signals that are periodically switching. LVP, on the other hand, enables timing measurement of internal signals within an IC, when transistors are switching. Thus, LVP enables non-contact probing of signals that is very useful in the debug of functional logic paths (e.g., by way of ATPG SAF patterns) that rely on non-periodic signals For both LVI and LVP, the spot size of the laser determines the optical resolution and the accuracy of the waveform, which is affected by the amount of signal crosstalk or coupling from adjacent signals (e.g., signals from adjacent circuit features). A typical solid immersion lens (SIL) of an LVI or LVP system would have a spot size of ~300 nm. As the process size of IC technology decreases, e.g., from 28 nm to 10 nm and beyond, the feature size (e.g., of a transistor) decreases and the density of features within an IC increases. Unfortunately, this leads to an increase in the amount of signal crosstalk and/or coupling during LVI and LVP testing because more signals are "visible" within the ~300 nm spot size of the laser. Such crosstalk and coupling cause signal distortion during laser-based testing procedures, which may negatively affect the performance of the testing procedures.

Accordingly, there is a need to provide techniques for reducing distortion during laser-based testing of integrated circuits.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly.

Certain aspects provide an integrated chip (IC) testing apparatus. The IC test apparatus generally includes an input pin; a decompressor connected to the input pin; a plurality of scan chains, each scan chain of the plurality of scan chains comprising a plurality of scan cells; a plurality of scan chain control elements, each scan chain control element of the plurality of scan chain control elements being connected between the decompressor and a respective scan chain of the plurality of scan chains, wherein each scan chain control element is configured to enable or disable test data from flowing from the compressor to the respective scan chain; a compressor connected to an output of each scan chain of the plurality of scan chains; and an output pin connected to the compressor.

Certain aspects provide a method for testing an integrated circuit. The method generally includes generating, by automatic test equipment, compressed test input data for a scan test core comprising a plurality of scan chains; selecting a scan chain of the plurality of scan chains for testing by enabling a scan chain control element associated with the selected scan chain; quieting the plurality of scan chains, other than the selected scan chain, by disabling scan chain control elements associated with the plurality of scan chains, other than the selected scan chain; receiving the compressed test input data at a decompressor of the scan test core; receiving test output data from the selected scan chain at a compressor of the scan test core; and receiving compressed test output data from the compressor at the automatic test equipment.

To the accomplishment of the foregoing and related ends, the one or more aspects comprise the features hereinafter fully described and particularly pointed out in the claims. The following description and the related drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the drawings illustrate only certain typical aspects of this disclosure and are therefore not to be considered limiting of its scope, for the description may admit to other equally effective aspects.

DETAILED DESCRIPTION

Aspects of the present disclosure provide systems, methods, and computer readable mediums for laser-based fault isolation and design for testability (DFT) diagnosis techniques.

As above, scan testing is a DFT methodology for checking the integrity of digital logic within integrated circuits (ICs), such as complementary metal oxide semiconductors (CMOS). Scan testing may utilize features built into an IC specifically for testing, such as scan cells.

A scan cell may generally comprise a multiplexer at the input of a flip-flop with one input of the multiplexer acting as the functional input D and the other input being a scan-input. The selection between the functional input D and the scan-input may be controlled by a scan enable signal. Scan cells may also include a scan-output and a functional output Q. Scan cells may be connected together (e.g., in series) to form a scan chain. When connected in such a manner, a scan chain may effectively acts as a shift register.

Generally, scan chain operation involves three steps: (1) scan-in, (2) scan-capture; and (3) scan-out. Scan-in involves shifting in and loading all the scan cells with test input data, such as an input data vector. During scan-in, the data flows from the output of one scan cell to the input of the next scan cell in the chain. Once the input data vector is loaded, a clock pulse excites a digital logic block and the output is captured at the next scan cell. The data is then shifted out and the signature is compared with an expected signature. Using this basic operation, an Automated Test Pattern Generation (ATPG) may try to test each and every node within a logic block of an IC.

Because modern ICs (e.g., semiconductor chips) have many nodes, testing time may be significant. Consequently, testing time is a significant factor in the cost of the design and launch of an IC. In some cases, testing may account for more than half of the total cost of the IC.

The total testing time using scan testing techniques may be related to the number of scan cells and the shifting frequency. While it may seem obvious to simply increase the frequency of shifting between the scan cells to reduce the time needed to test an IC, higher shifting frequency can lead to problematic voltage drops within the IC. This is because the higher rate of shifting during testing draws more current from the voltage supply and may exceed its capability. Voltage drops within the IC may cause the semiconductor chip to operate improperly. Further, high-frequency shifting might increase the operating temperature of the IC so much that the IC may not operate correctly, or worse, that the IC may become damaged. Accordingly, the shifting frequency during testing tends to remain low to avoid these problems.

Scan test compression is a DFT technique meant to reduce test time and test data volume on automated test pattern generation (ATPG) patterns without the aforementioned problems (i.e., voltage drop or overheating). Generally, scan test compression involves creating many parallel scan chains comprising scan cells that may shift test data simultaneously. However, because these scan chains may also have defects, it is necessary to perform scan chain integrity tests. These tests face the same challenges created by decreasing feature size, namely that failure analysis techniques such as LVI and LVP are difficult to implement on increasingly small features of the scan chains.

Figure 1:
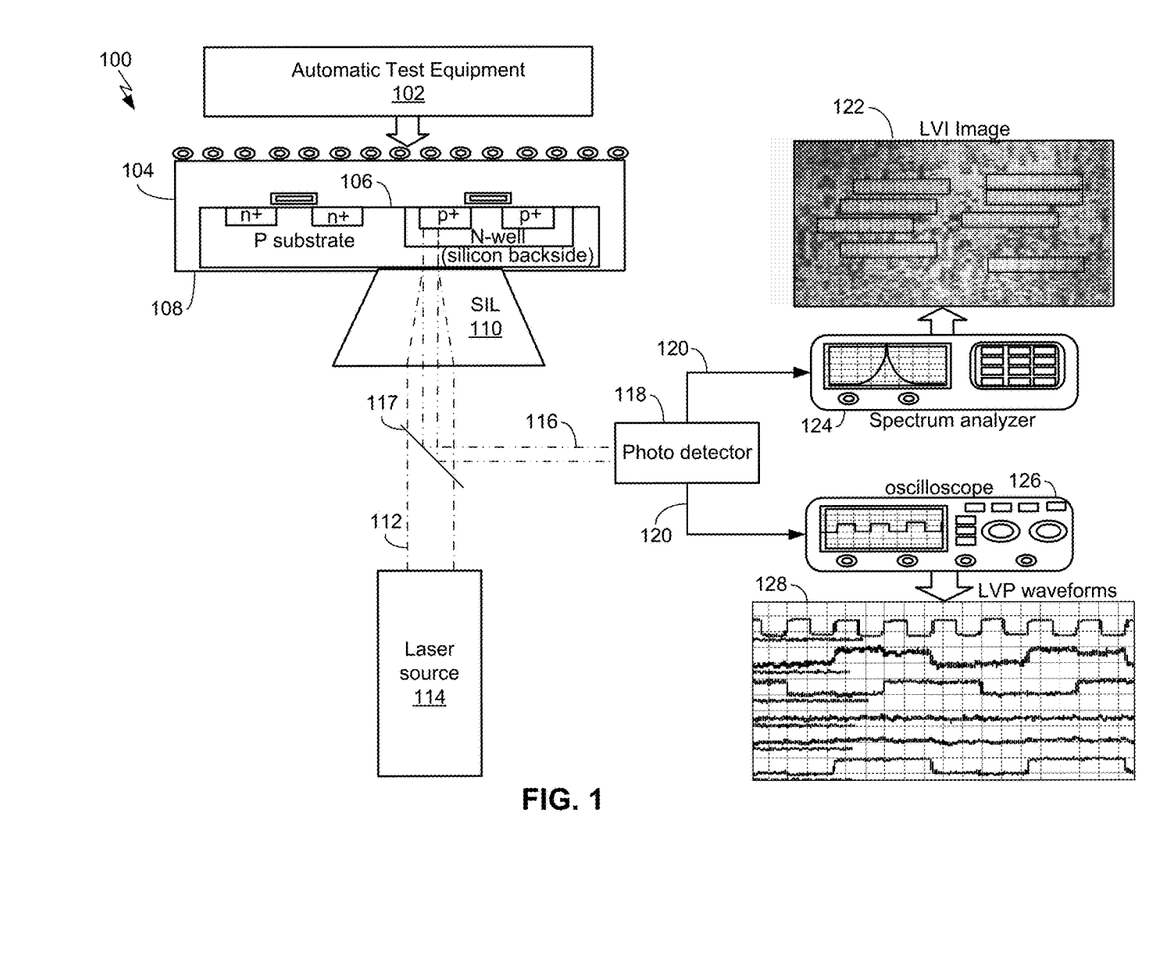
FIG. 1 depicts a laser testing system configured to perform laser-based fault detection.

FIG. 1 depicts a laser testing system 100 configured to perform laser-based fault detection, for example, by way of LVI and LVP. A device 104 including an integrated circuit to be analyzed may first be deencapsulated in order to expose the backside 108 of the silicon substrate 106. The silicon substrate 106 may then be thinned mechanically using a back side mechanical thinning tool. The thinned device 104 may then be mounted on a carrier board on a loadboard and connected to automatic test equipment (ATE) 102, which provides a source of test signals and data. Thereafter, signal measurements may be performed through the back side 108 of the device 104. For example, device 104 may be probed using a laser while being electrically stimulated by automatic test equipment 102 using a repeating test pattern (e.g., "0011"), and a trigger pulse may be provided to the LVP/LVI system 100 as a reference.

In some examples, a laser 112 from a laser source 114 may scan the backside 108 of the silicon substrate 106 via a high magnification solid immersion lens (SIL) 110. SIL 110 may be a spring-loaded lens that makes direct contact with the backside 108 of the silicon substrate 106. The incident beam of the laser 112 may be focused onto the active layer of the silicon substrate 106 so that the reflected beam 116 may provide physical details of the scanned active area of the silicon substrate 106. The laser 112 may be reflected back 116 to a photo detector 118 by way of a reflective element 117 (e.g., a one-way mirror).

During a scan of the active layer of the silicon substrate 106, the reflected beam 116 may be modulated by the signal of a feature in the scanned area, such as a transistor, buffer, or other integrated circuit element. The high frequency component 120 of the reflected beam 116 of laser may be supplied to the input of a spectrum analyzer 124 that may be tuned to a specific frequency. The spectrum analyzer 124 may then provide LVI image 122, which provides information about the reflected beam 116 of laser in the frequency domain. The high frequency component 120 of the reflected beam 116 of laser 112 may also be supplied to an oscilloscope 126 to provide information in the time domain as LVP waveforms 128. Thus, an analysis of the LVI image and the LVP waveforms may provide information regarding the function (or dysfunction) of IC features of device 104.

Figure 2A:
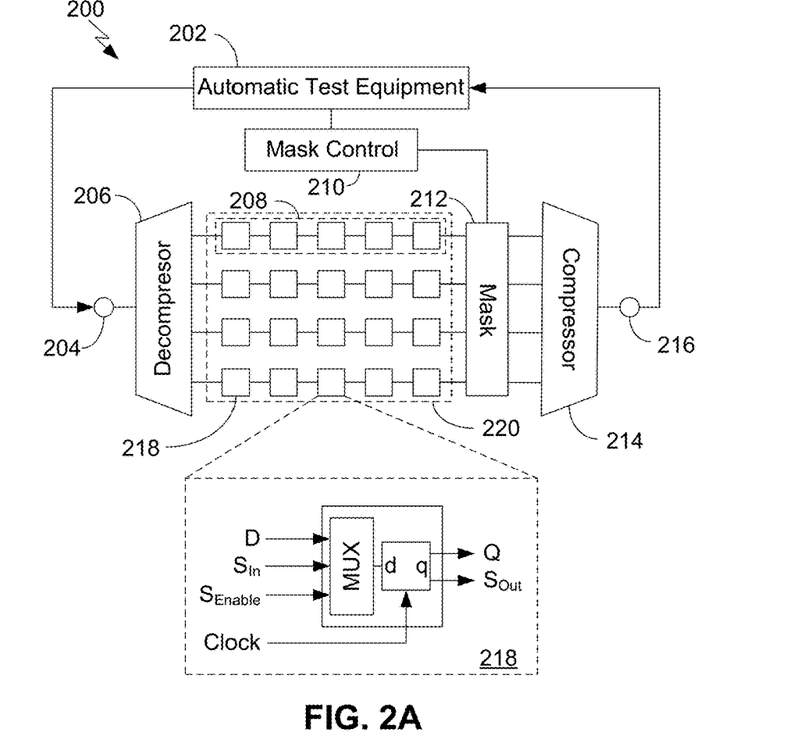
FIG. 2A depicts an example of a scan test core in the compressed mode.

FIG. 2A depicts an example of a scan test core 200 in the compressed mode. Scan test core 200 includes a plurality of scan chains (e.g., 208), which may include one or more scan cells (e.g., 218). The plurality of scan chains may collectively form a scan channel 220 (also known as a stump). Though not shown in FIG. 2A, an IC may include many scan channels. In some embodiments, each scan channel (e.g., 220) is connected to its own input and output pin (e.g., 204 and 216). Notably, scan test core 200 of FIG. 2A includes an arbitrary number scan chains (e.g., 208) and scan cells (e.g., 218). Other embodiments may include any number of each of these features.

In typical operation, automatic test equipment 202 generates compressed test input data vectors and transmits them to input pin 204 of scan test core 200. From input pin 204 the compressed test input data vectors move to decompressor 206, which decompresses the compressed test input data vectors. The decompressed test input data is then distributed to a number of scan chains, such as scan chain 208. The scan chains (e.g., 208) are in-turn connected to an output mask 212 under the control of mask control 210. The mask control 210 may "mask" the output of the scan chains so that the output from a selected scan chain may be analyzed. Other embodiments may not include the output mask 212 or mask control 210. The output from the mask 212, which may include test output data from one or more scan chains depending on the mask control 210, is then compressed by compressor 214 (also known as a compactor) and sent to output pin 216. From output pin 216, the test output data returns to automatic test equipment 202 for analysis. When the scan chains are properly configured, the scan test core can achieve significant test time and test data volume reduction.

As depicted in FIG. 2A, one embodiment of a scan cell 218 may include a mux with three inputs, including a functional input 'D', a scan-input "$S_{In}$", and a scan enable input "$S_{Enable}$". The mux may be connected to a flip-flop with a clock input as well as a functional output 'Q' and a scan-output "$S_{Out}$". The scan enable input may put scan cell 218 into a test mode where periodic test data is passed from one scan cell to another in a scan chain.

Scan test core 200 may generally be operated in two "modes:" compressed mode, where data flows through the scan chains (within a channel) in parallel, and uncompressed mode, where data flows through the scan chains sequentially (i.e., from start to finish of a first chain, then start to finish of a second chain, and so on). Compressed mode is more common for test optimization purposes because it is generally faster to test the data in parallel than in series. However, diagnosing IC failures from compressed patterns can be challenging due to the complexity of the compression logic (e.g., applied by decompressor 206 and compressor 214).

Because an IC may include many scan channels (e.g., 220), special test input data vectors called "1-hot" vectors may be used to sensitize one scan channel at a time. Note that FIG. 2A only depicts one scan channel 220, but typical embodiments of an IC may include many scan channels, each comprised of multiple scan chains. Sensitizing a single scan channel at a time facilitates more accurate failure diagnosis because other scan channels may be ignored. However, because "1-hot" vectors still stimulate all scan chains (e.g., 208) in a scan channel (e.g., 220) at once, output mask 212 may be used to analyze the output of a single scan chain at once. In some embodiments, the masking logic may instead be in integral with compressor 214.

Figure 2B:
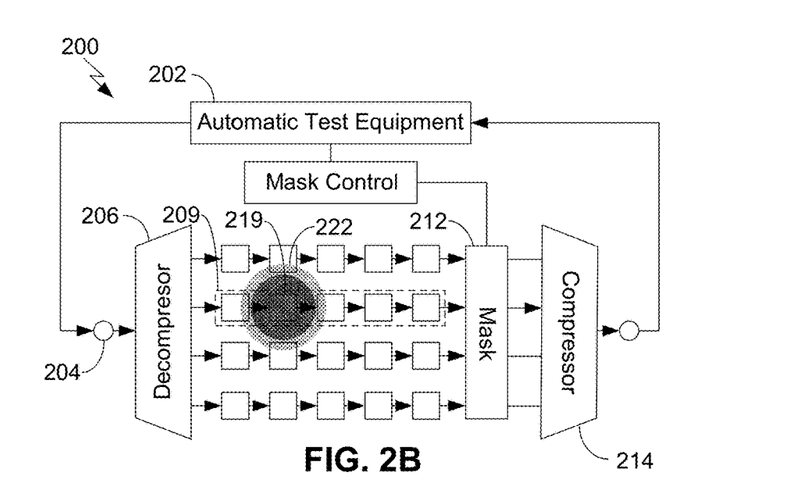
FIG. 2B depicts an example of testing a scan chain by focusing the laser spot on a chain of interest and masking the test output data.

FIG. 2B depicts an example of testing a scan chain by focusing a laser spot on a chain of interest and masking the test output data. As depicted, compressed test input data is inputted from automatic test equipment 202 to decompressor 206, which distributes decompressed test input data to all of the scan chains (e.g., 209) in parallel. While the test data stimulates all of the scan chains at once, output mask 212 only passes test output data from a single scan chain (here, 209) to compressor 214. In this way, it is possible to test the output of a single scan chain (here, 209) at once.

If an error is detected by automatic test equipment 202 based on the output of scan chain 209, then a procedure such as LVI or LVP may be desirable to test elements of scan chain 209 (e.g., scan cell 219) for defects. For example, a laser spot 222 from a laser testing system, such as described with respect to FIG. 1, may be focused on scan cell 219 of scan chain 209. However, as depicted in FIG. 2B, laser spot 222 may overlap multiple scan cells adjacent to target scan cell 219. In other cases, laser spot 222 may overlap other features within a single scan cell (e.g., transistors adjacent to a target transistor). In some cases, the overlap may only be with a boundary or unfocussed portion of the laser spot (e.g., the lighter portion of laser spot 222). Notably, the size of laser spot 222 in FIG. 2B in merely one example; the relative size of the laser spot to features of an integrated circuit may change based on the type of laser used, the lens, the process size of the device being tested, etc. In any case, laser spot 222 overlapping adjacent features may lead to cross-talk or coupling with other non-targeted scan cells or other non-targeted features, which negatively affects the testing procedure. Thus, even with masking the output of scan chain 209, the other scan chains may interfere with or corrupt the laser-based test data due to the feature size of a scan cell being smaller than the size of laser spot 222. Notably, this would be true in either a compressed mode (such as shown) or an uncompressed mode (not shown) because all of the scan cells in the scan chains within the scan channel would be switching based on the test data (e.g., "0011").

Improved Scan Chain Control for Laser-Based Testing

Figure 3A:
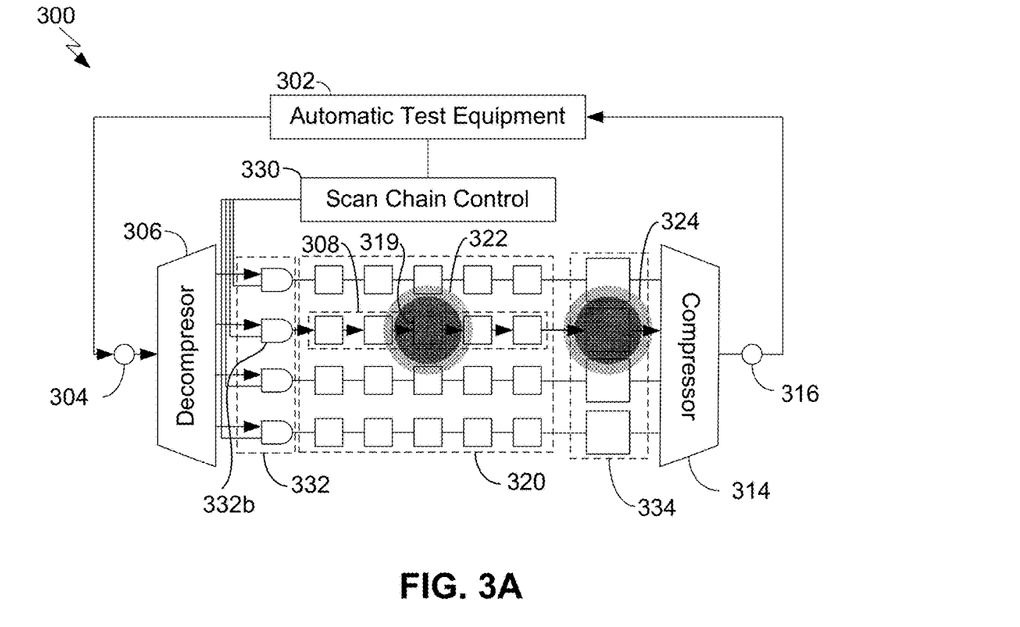
FIG. 3A depicts a scan test core configured for improved scan chain control during testing.

FIG. 3A depicts a scan test core 300 configured for improved scan chain control during laser-based testing. As compared to scan test core 200 in FIGS. 2A and 2B, scan test core 300 includes scan chain control elements 332 under control of scan chain control 330. Scan chain control elements 332 can be, for example, gating logic, such as an and logic gate (depicted), a nand logic gate, a mux, or the like. The purpose of scan chain control elements 332 is to provide a way to deactivate specific scan chains within a scan channel (e.g., 320) while still testing scan test core 300 in a compressed mode. In the depicted example, scan chain control 330 is under control of automatic test equipment 302, but in other embodiments scan chain control may be independently controlled or may be integral with automatic test equipment 302. For example, the scan chain control elements may be set via registers in a device being tested by a test pattern produced by the automatic test equipment.

As depicted, automatic test equipment 302 generates compressed test input data. In some embodiments, these compressed test input data may be "1-hot" vectors, as described above, which activate a single scan channel (e.g., 320) at a time. The compressed test input data enter decompressor 306 by way of input pin 304. Decompressor 306 decompresses the compressed test input data and distributes decompressed test input data to the various scan chains (e.g., 308). However, unlike the embodiment depicted in FIGS. 2A and 2B the test input data is either stopped or allowed by scan chain control elements 332. Thus, in the depicted example, test data only flows through selected scan chain 308 by means of the associated scan chain control element 332b, which is activated by scan chain control 330. The other scan chains (i.e., the unselected scan chains) are thus "quieted" because they will not switch with test data like selected scan chain 308.

Controlling the flow of test input data into the scan chains from the start of the scan chains via scan chain control elements, as depicted in FIG. 3, creates many advantages as compared to the embodiments depicted in FIGS. 2A and 2B.

First, by controlling the flow of test input data to a selected scan chain (here, 308), laser spot 322 (such as may be used for LVP or LVI) is not affected by the scan cells in adjacent scan chains. As depicted by the lack of arrows, the "quieted" scan chains' scan cells are not switching because they are not receiving the decompressed test input data because of the action of the scan chain control elements. Consequently, the quieted scan chains will not create interference (e.g., coupling or crosstalk) with targeted test cell 319 during testing. Thus, LVI and LVP may be used on smaller features, e.g., during a scan chain integrity test, despite the constraints of the laser spot size. For example, LVI and LVP may be useable on scan chains at a 10 nm and 7 nm process size with scan chain quieting provided by the scan chain control elements.

A second advantage of scan core 300 is that the mask control and output mask may be omitted because controlling the flow of test input data from the start of the chain means that the test output data from the selected scan chain is the only output arriving at compressor 314. However, in some embodiments the mask control and output mask may be retained for additional testing versatility. For example, where the mask control and output mask are integral with the compressor, the addition of scan chain control elements does not require that the compressor be redesigned to remove the mask control and output mask.

A third advantage of scan core 300 is that quieting the unselected scan chains results in lower power usage because fewer scan cells are being switched. Thus the problems associated with voltage drop are mitigated. Consequently, it is possible to increase the switching frequency, which beneficially increases the speed of the testing.

A fourth advantage of scan core 300 is that quieting the unselected scan chains also results in lower heat production, which also mitigates the problems of heat-induced failures discussed above.

Scan test core 300 includes another enhancement as compared to the embodiments depicted in FIGS. 2A and 2B: laser probe cells 334. Laser probe cells 334 may be, for example, large drive buffers, that are located within a scan path. In the embodiment depicted in FIG. 3A, laser probe cells 334 are in line with the scan chains after the last scan cell. In this configuration, the laser probe cells act like repeaters for data flowing through the scan chains. In other embodiments, laser probe cells 334 may be located, for example: before the first scan cell in a scan chain; before decompressor 306, after compressor 314, before or after an I/O pad (e.g., a general purpose input/out (GPIO) pad), and the like.

Laser probe cells 334 may purposefully be significantly larger than the feature size of other circuit elements, such as scan cells (e.g., 319) so that LVP may be easier to perform. In other words, by making laser probe cells larger (i.e., closer to the size of the laser spot size), the performance of LVP-based testing may be improved because the larger area of the laser probe cells provides a larger surface to reflect a targeted laser spot. As depicted in FIG. 3A, the laser probe cells are nearly the size of the focused (darker) portion of laser spot 324. Thus, the return signal from the laser spot will be improved compared to smaller features.

Laser probe cells 334 may also be purposefully located away from circuit features targeted for testing. By locating the laser probe cells 334 away from these features, cross-talk and coupling from adjacent circuit features may be beneficially reduced.

Figure 3B:
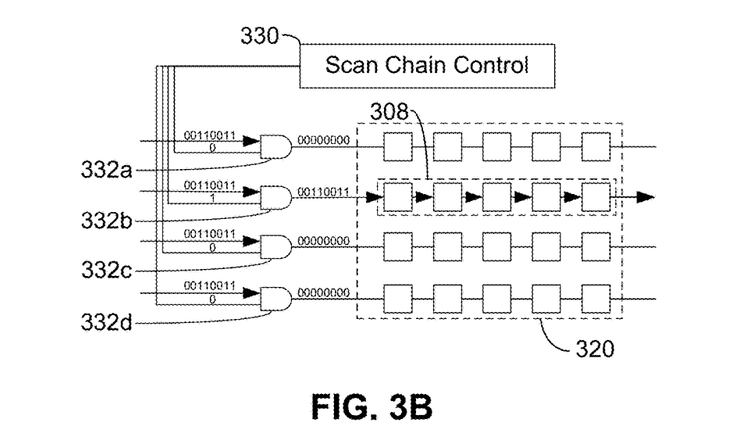
FIG. 3B depicts further aspects of the operation of scan chain control elements.

FIG. 3B depicts further aspects of the operation of scan chain control elements. As depicted, the four scan chain elements 332a-d are under control of scan chain control 330, as in FIG. 3A. In this example, scan chain control element 332b is an and logic gate that has been enabled by a logic '1' signal on a control line from scan chain control 330. Scan chain control elements 332a, 332c, and 332d are disabled by logic '0' signals on each associated control line from scan chain control 330. Thus, the test data pattern ("00110011") that is supplied to every scan chain control element (e.g., from a decompressor as depicted in FIG. 3A) only passes scan chain control element 332b, which is "enabled" via scan chain control 330. This allows selective testing of scan chain 308. Conversely, the test data pattern does not pass scan chain control elements 332a, 332c, and 332d. Instead, a non-switching data pattern (e.g., "00000000") propagates to the non-selected scan chains. As such, the other scan chains are "quieted" because they are not switching as scan chain 308 switches with the test data pattern.

Figure 4:
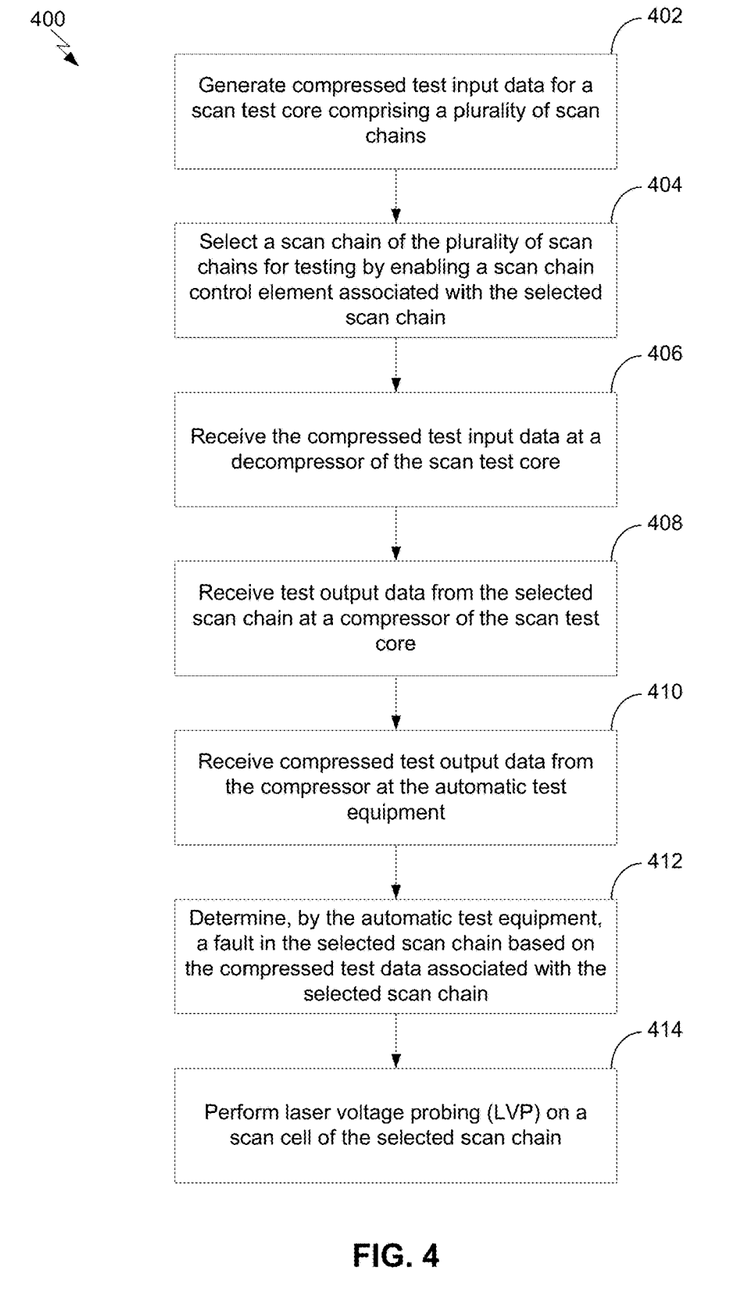
FIG. 4 depicts a method of testing using a laser-based test system and scan chain control elements.

FIG. 4 depicts a method 400 of testing using a laser-based test system and scan chain control elements. The method begins at step 402 where compressed test input data for a scan test core comprising a plurality of scan chains is generated. For example, automatic test equipment such as described above with respect to FIGS. 2A, 2B, 3A, and 3B may generate the compressed test input data. In some embodiments, the automatic test equipment may generate 1-hot test input data vectors.

The method 400 then proceeds to step 404 where a scan chain of the plurality of scan chains is selected for testing by enabling a scan chain control element associated with the selected scan chain. In some embodiments, as described above with respect to FIGS. 3A and 3B, a scan chain control element may be an and logic gate or a mux or any other circuit feature capable of selectively enabling or disabling data from flowing from that feature.

In some embodiments, steps 402 and 404 may be part of an initialization performed by automatic test equipment, such as described with respect to FIG. 1. For example, the automatic test equipment may generate a test pattern that includes an initialization that: turns on or off certain parts of the integrated circuit; sets the state of scan chain control elements (e.g., by way of registers) to target a specific scan chain, sets the mode of a test core (e.g., a compressed or uncompressed mode), etc.

The method 400 then proceeds to step 406 where the compressed test input data is received at a decompressor of the scan test core, such as the decompressors described above with respect to FIGS. 2A, 2B, 3A, and 3B.

The method 400 then proceeds to step 408 where test output data from the selected scan chain is received at a compressor of the scan test core, such as the compressors described above with respect to FIGS. 2A, 2B, 3A, and 3B. As described with respect to FIGS. 3A and 3B, above, the test output data may be based on the scan chain selected via the scan chain control element in step 404.

The method 400 then proceeds to step 410 where compressed test output data from the compressor is received at the automatic test equipment.

The method 400 then proceeds to step 412 where a fault in the selected scan chain is detected based on the compressed test output data associated with the selected scan chain. For example, automatic test equipment may be expecting a certain pattern of test data to be returned that does not match the test output data actually received. In such a case, the automatic test equipment may determine that the selected scan chain has a fault.

The method 400 then proceeds to step 414 where laser voltage probing (LVP) is performed on a scan cell of the selected scan chain. For example, as described above with respect to FIGS. 1 and 3, a laser point may be focused on a scan cell of the selected scan chain in order to analyze waveforms associated with the scan cell. In some examples, analysis of these waveforms may reveal a fault in the scan cell.

Figure 5:
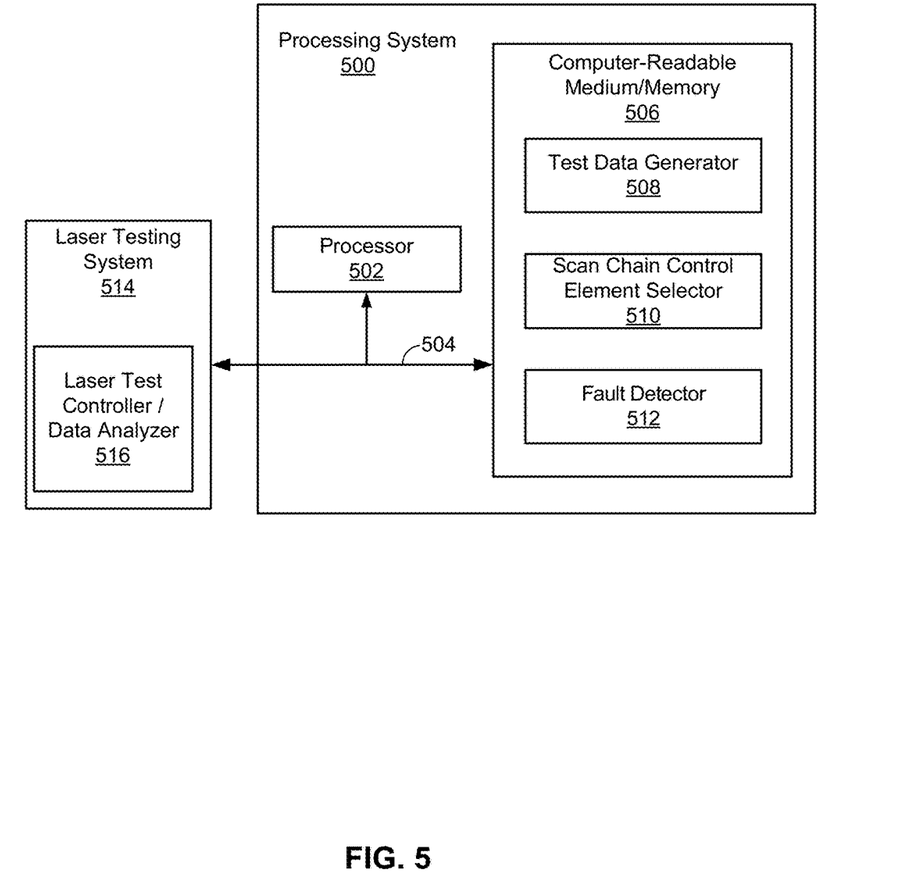
FIG. 5 depicts a processing system configured perform methods of testing using a laser-based test system and scan chain control elements To facilitate understanding, identical reference numerals have been used, where possible, to designate identical elements that are common to the figures. It is contemplated that elements disclosed in one aspect may be beneficially utilized on other aspects without specific recitation.

FIG. 5 depicts a processing system 500 configured perform methods of testing using a laser-based test system and scan chain control elements, such as the method described with respect to FIG. 4.

Processing system 500 includes a processor 502 coupled to a data bus 504, which is in-turn coupled to computer-readable memory 506 and laser testing system 514.

The computer-readable memory (i.e., medium) 506 includes a test data generator 508, which may generate test input data, such as compressed test input data, as described above with respect to FIGS. 1-4. In some embodiments, test data generator 508 may generate 1-hot test input data vectors as described above. Further, test data generator 508 may generate test patterns, including initialization data, as described above with respect to FIG. 4.

The computer-readable memory 506 also includes a scan chain control element selector 510, which may control the selection of scan chain control elements, as described above with respect to FIGS. 3 and 4.

The computer-readable memory 506 also includes a fault detector 512, which may detect faults in test output data. For example, as described above with respect to FIG. 4, the processing system 500 may determine that test output data does not match a form or format expected based on the generated test input data. In such cases, the fault detector may determine that there is a fault in the IC being tested.

Laser testing system 514 includes a laser test controller and data analyzer 516, which controls laser testing system 514 and analyzes data returned from laser testing procedures, such as LVI and LVP data. For example, as described above with respect to FIGS. 1 and 4, the laser test controller and data analyzer 516 may generate laser voltage images (via LVI) and signal waveforms (via LVP). In some embodiments, laser test controller and data analyzer 516 may receive data from processing system 500, such as references signals or pulses, which may be used for synchronizing data between laser test controller and data analyzer 516 and processing system 500.

Notably, processing system 500 is just one embodiment, and other embodiments including other aspects are possible.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 4.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of testing an integrated circuit (IC), comprising:
   generating, by automatic test equipment, compressed test input data for a scan test core comprising a plurality of scan chains;
   selecting a scan chain of the plurality of scan chains for testing by enabling a scan chain control element associated with the selected scan chain;
   quieting the plurality of scan chains, other than the selected scan chain, by disabling scan chain control elements associated with the plurality of scan chains, other than the selected scan chain;
   receiving the compressed test input data at a decompressor of the scan test core;
   focusing a laser spot on a laser probe cell, wherein:
      the laser probe cell is connected in series between a last scan cell of the selected scan chain and a compressor of the scan test core, and
      the laser probe cell has a larger surface area than any scan cell in the selected scan chain;
   performing laser voltage probing on the laser probe cell;
   receiving test output data from the selected scan chain at a compressor of the scan test core; and
   receiving compressed test output data from the compressor at the automatic test equipment.

2. The method of claim 1, wherein the scan chain control element comprises an and logic gate.

3. The method of claim 1, wherein the scan chain control element comprises a mux.

4. The method of claim 1, wherein the laser probe cell is approximately the same size as the laser spot.

5. The method of claim 1, further comprising: propagating a non-switching data pattern to the plurality of scan chains, other than the selected scan chain.

6. The method of claim 1, wherein selecting the scan chain of the plurality of scan chains for testing by enabling the scan chain control element associated with the selected scan chain comprises setting, by the automatic testing equipment, registers in a device being tested.

7. A non-transitory computer-readable medium comprising instruction that when executed by a processor of a processing system, cause the processing system to perform a method of testing an integrated circuit (IC), the method comprising:

generating, by automatic test equipment, compressed test input data for a scan test core comprising a plurality of scan chains;

selecting a scan chain of the plurality of scan chains for testing by enabling a scan chain control element associated with the selected scan chain;

quieting the plurality of scan chains, other than the selected scan chain, by disabling scan chain control elements associated with the plurality of scan chains, other than the selected scan chain;

receiving the compressed test input data at a decompressor of the scan test core;

focusing a laser spot on a laser probe cell, wherein:

the laser probe cell is connected in series between a last scan cell of the selected scan chain and a compressor of the scan test core, and the laser probe cell has a larger surface area than any scan cell in the selected scan chain, performing laser voltage probing on the laser probe cell receiving test output data from the selected scan chain at a compressor of the scan test core; and receiving compressed test output data from the compressor at the automatic test equipment.

8. The non-transitory computer-readable medium of claim 7, wherein the scan chain control element comprises an and logic gate.

9. The non-transitory computer-readable medium of claim 7, wherein the scan chain control element comprises a mux.

10. The non-transitory computer-readable medium of claim 7, wherein the laser probe cell is approximately the same size as the laser spot.

11. The non-transitory computer-readable medium of claim 7, wherein the method further comprises: propagating a non-switching data pattern to the plurality of scan chains, other than the selected scan chain.

12. The non-transitory computer-readable medium of claim 7, wherein selecting the scan chain of the plurality of scan chains for testing by enabling the scan chain control element associated with the selected scan chain comprises setting, by the automatic testing equipment, registers in a device being tested.

* * * * *